(12) United States Patent  (10) Patent No.: US 7,074,683 B2
Hwang et al.  (45) Date of Patent: Jul. 11, 2006

(54) SEMICONDUCTOR DEVICES AND METHODS OF FABRICATING THE SAME

(75) Inventors: Sun-Ha Hwang, Kyunggi-do (KR); Young-Ok Kim, Kyunggi-do (KR); Cha-Dong Yeo, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/796,754

(22) Filed: Mar. 8, 2004

(65) Prior Publication Data

US 2004/0180502 A1  Sep. 16, 2004

Related U.S. Application Data

(62) Division of application No. 10/289,721, filed on Nov. 6, 2002, now Pat. No. 6,730,871.

(30) Foreign Application Priority Data

Dec. 18, 2001  (KR) ............................... 2001-80481

(51) Int. Cl.
 *H01L 21/336* (2006.01)
(52) U.S. Cl. .................. 438/300; 438/682; 438/723; 257/E21.619; 257/E21.006
(58) Field of Classification Search ........ 257/E21.619, 257/E21.006; 438/300, 682, 723
 See application file for complete search history.

(56) References Cited

U.S. PATENT DOCUMENTS 5,741,735 A * 4/1998 Violette et al. ............. 438/279

6,627,502 B1  9/2003 Cho ........................... 438/265

FOREIGN PATENT DOCUMENTS

| KR | 2001-0065747 A | * 12/1999 |
| KR | 2001-65747 | 7/2001 |
| KR | 2001-77099 | 8/2001 |

OTHER PUBLICATIONS

English translated Korean patent publication (Kr 2001-0065747 A ).*
English language of Abstract for Korean Patent Publication No. 2001-77099 published Aug. 17, 2001.
English language of Abstract for Korean Patent Publication No. 2001-65747 published Jul. 11, 2001.

* cited by examiner

*Primary Examiner*—W. David Coleman
*Assistant Examiner*—Su C. Kim
(74) *Attorney, Agent, or Firm*—Marger Johnson & McCollom, P.C.

(57) ABSTRACT

A semiconductor device comprises a device isolation layer disposed in a portion of a substrate of first conductivity type. An outline of the device isolation layer defines an active region of the substrate. An impurity diffused region of second conductivity type may be formed in a portion of the active region; and a silicide layer may be formed to cover the impurity diffused region of second conductivity type. The device isolation layer may include a recess formed therein to expose a portion of the substrate of first conductivity type adjacent to the impurity diffused region of second conductivity type. The silicide layer that is formed to cover the impurity diffused layer of second conductivity type may extend over and against the exposed region of the substrate of first conductivity type that was exposed by the recess of the device isolation layer.

17 Claims, 8 Drawing Sheets

US 7,074,683 B2

SEMICONDUCTOR DEVICES AND METHODS OF FABRICATING THE SAME

RELATED APPLICATION

This application is a divisional of U.S. patent application Ser. No. 10/289,721, filed on Nov. 6, 2002, now U.S. Pat. No. 6,730,871, which is herein incorporated by reference in its entirety.

BACKGROUND OF THE INVENTION

The present disclosure relates to semiconductor devices and, more particularly, to MOS transistors and their methods of fabrication with well or substrate body bias provisions electrically connected to one of a transistor's source/drain regions.

A semiconductor integrated circuit may comprise a plurality of NMOS transistors on P-type well(s) and PMOS transistor on N-type well(s). Generally, the semiconductor integrated circuit may comprise provisions for grounding or applying a voltage to the N-type well(s) or the P-type well(s). For conventional devices, the transistors are formed on active regions of the wells, which may extend to regions separate and beyond the fabricated transistors to receive well or substrate body biasing. For some conventional devices, a plurality of transistors may be formed on a single well, which likewise may receive well biasing at region(s) separate from the plurality of transistors.

Referring to FIG. 1, a conventional semiconductor device may comprise device isolation layer 12 disposed in a predetermined region of a semiconductor substrate. The device isolation layer 12 may comprise an outline that defines first and second active regions in respective N-type and P-type regions 10a, 10b of the substrate. A PMOS transistor may be formed on the first active region of N-type region 10a between sidewalls 13a of isolation layer 12. Likewise, an NMOS transistor may be formed on the second active region of the P-type region 10b between sidewalls 13b of isolation layer 12.

The PMOS transistor may comprise first gate pattern 14a crossing the first active region. P-type source/drain regions 16a of the PMOS transistor may be formed in the first active region on opposite sides of first gate pattern 14a. The NMOS transistor may comprise second gate pattern 14b crossing the second active region. N-type source/drain regions 16b of the NMOS transistor may be formed in the second active region on opposite sides of the second gate pattern 14b.

As shown in FIG. 1, such conventional semiconductor device may further comprise well bias regions 18a and 18b for enabling connection of respective N-well and P-well regions to receive respective well or substrate body biasings. Well bias regions 18a and 18b may be formed separate from their respective transistors but within the active regions of the transistors.

For highly integrated semiconductor devices, well bias regions may be formed at regular intervals in predetermined regions of the semiconductor substrate for a plurality of transistors and active regions. Referencing FIG. 2, such conventional semiconductor device 21 may comprise well bias regions 28 coupled at regular intervals to bias well 20B of the semiconductor substrate.

For this example, further referencing the conventional device of FIG. 2, device isolation layer 22 may be formed in a predetermined region of the semiconductor substrate 20 and with sidewalls 23 forming an outline to define a plurality of active regions. Transistors may be formed on the respective active regions. Each well bias region 28 which may be associated with a group of the plurality of the transistors may be coupled to a common well bias region 28. Unfortunately, however, the single common well bias region 28 of such conventional device, as shown in FIG. 2, may adversely affect an integrity of transistors 25 that may be more distant from well bias region 28. Such distant transistors may be more vulnerable to latch-up phenomenon or abnormal noise.

SUMMARY OF THE INVENTION

In accordance with an embodiment of the present invention, highly integrated semiconductor devices may be fabricated with structures resistant to latch-up phenomenon.

In one exemplary embodiment of the present invention, a semiconductor device comprises a substrate of first conductivity type. A device isolation layer may be disposed in a predetermined region of the substrate and may comprise an outline to define an active region. Second conductivity type impurities may be diffused into an impurity diffused layer within the active region. A silicide layer may be formed to cover the impurity diffused layer of second conductivity type. A recess in the device isolation layer may expose a region of the substrate of first conductivity type adjacent to the impurity diffused layer of second conductivity type. The silicide layer may be formed to cover the impurity diffused layer of second conductivity type. The silicide layer may also extend into the recess to cover a region of the substrate of first conductivity type that is exposed by the recess.

In a further embodiment of the present invention, the active region may include source/drain regions of a transistor. A gate pattern for the transistor may cross the active region with the source/drain regions of second conductivity type on opposite sides of the gate pattern. Each one of the source/drain regions of second conductivity type may be covered with the salicide layer. A recess of a device isolation layer may expose a predetermined region of the semiconductor substrate of first conductivity type that is adjacent to one of the source/drain regions of second conductivity type. The salicide layer that covers the one source/drain region may extend into the recess to cover the surface of the substrate of first conductivity type that faces inwardly toward the recess.

In another embodiment of the present invention, a semiconductor device comprises a semiconductor substrate of N-type and P-type regions. A device isolation layer may be formed in predetermined regions of the semiconductor substrate with an outline to define first and second active regions in the respective N-type and P-type regions of the substrate. First and second gate patterns may cross the first and second active regions, respectively. A pair of P-type source/drain regions may be formed in the first active region at opposite sides of the first gate pattern. A pair of N-type source/drain regions may be formed in the second active region at opposite sides of the second gate pattern. A silicide layer may cover N-type source/drain regions and the P-type source/drain regions. The device isolation layer may further comprise a first recess that exposes a portion of the N-type region of the substrate adjacent to one of the P-type source/drain regions. The device isolation layer may also comprise a second recess that exposes a portion of the P-type region of the substrate adjacent to one of the N-type source/drain regions. The salicide layer on the select one of the N-type source/drain regions may extend into the first recess to cover the face of the P-type region of the substrate that faces the first recess. Likewise, the salicide layer on the selected one of the P-type source/drain regions may extend into the second recess to cover the face of the N-type region of the substrate that faces the second recess.

In accordance with another embodiment of the present invention, a method of fabricating a semiconductor device comprises forming a device isolation layer in a predetermined region of a substrate of first conductivity type. The isolation layer may be formed with an outline to define an active region. Impurities of second conductivity type may be formed in a impurity diffusion region of the active region. A predetermined region of the device isolation layer may then be etched to form a recess and expose a portion of the substrate of first conductivity type adjacent to the impurity diffusion region of second conductivity type. A suicide layer may then be formed to cover the impurity diffused region of second conductivity type and to cover the exposed regions of the substrate of first conductivity type within the recess.

In a further embodiment of the present invention, a gate pattern may be formed to cross the active region. Second conductivity type impurities may be diffused into portions of the active region to form a pair of source/drain regions of second conductivity type in a surface layer of the active region at opposite sides of the gate pattern. When etching the device isolation layer to form the recess, a portion of the substrate of first conductivity type adjacent one of the source/drain regions may be exposed. After forming the recess, a silicide may be formed on a surface of the source/drain regions of second conductivity type and a surface of the substrate of first conductivity type that may be exposed within the recess.

BRIEF DESCRIPTION OF THE DRAWINGS

Exemplary embodiments of the present invention may be described more fully hereinafter with reference to the accompanying drawings, in which.

DETAILED DESCRIPTION

Figure 1:
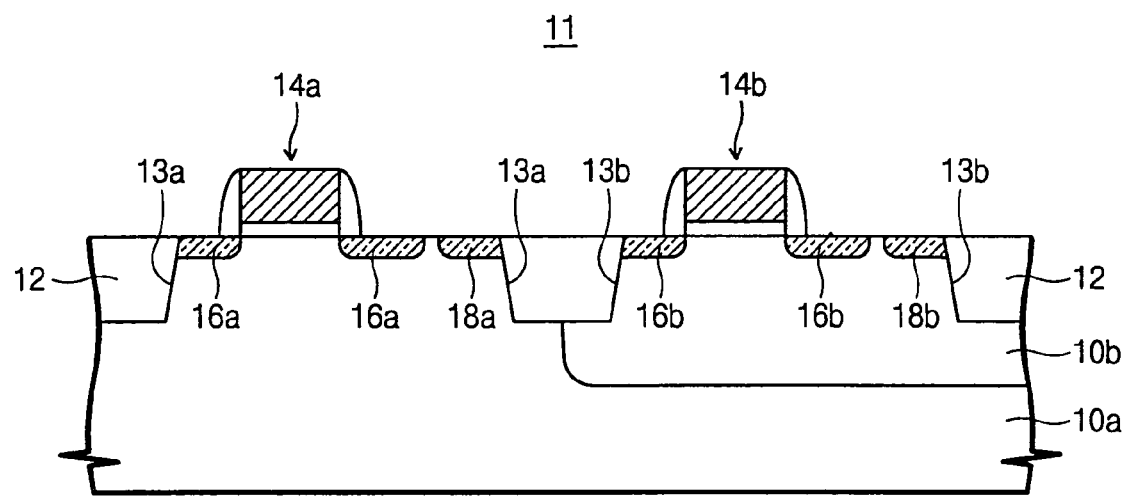
FIGS. 1 and 2 are cross-sectional views for illustrating a conventional semiconductor device.
Figure 2:
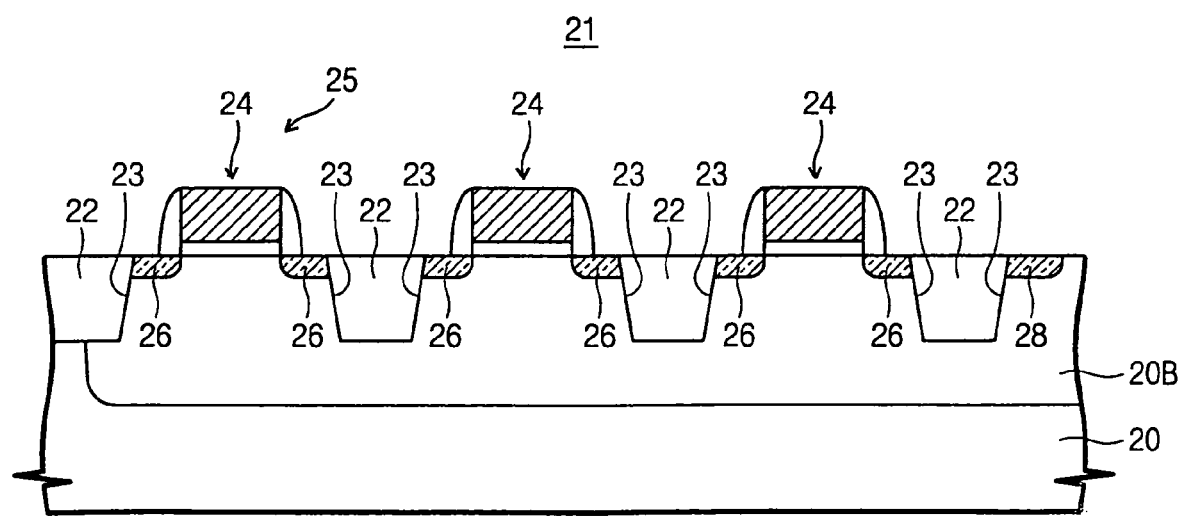

Although, exemplary embodiments may be described hereinafter with reference to the accompanying drawings; it will be understood that the invention may, however, be embodied in different forms and should not be construed as limited to the specifically described and illustrated exemplary embodiments as set forth herein. Rather, the exemplary embodiments described herein are provided so that this disclosure will be thorough and complete, and to convey the invention to those skilled in the art.

In the drawings, like numbers may refer to like elements throughout. Additionally, the thickness of various layers and regions may be exaggerated for clarity.

As described herein, a layer may be referenced as being "on" another layer or substrate. It will be understood that such layer may be directly on another layer or substrate, or intervening layers may also be present.

Figure 3:
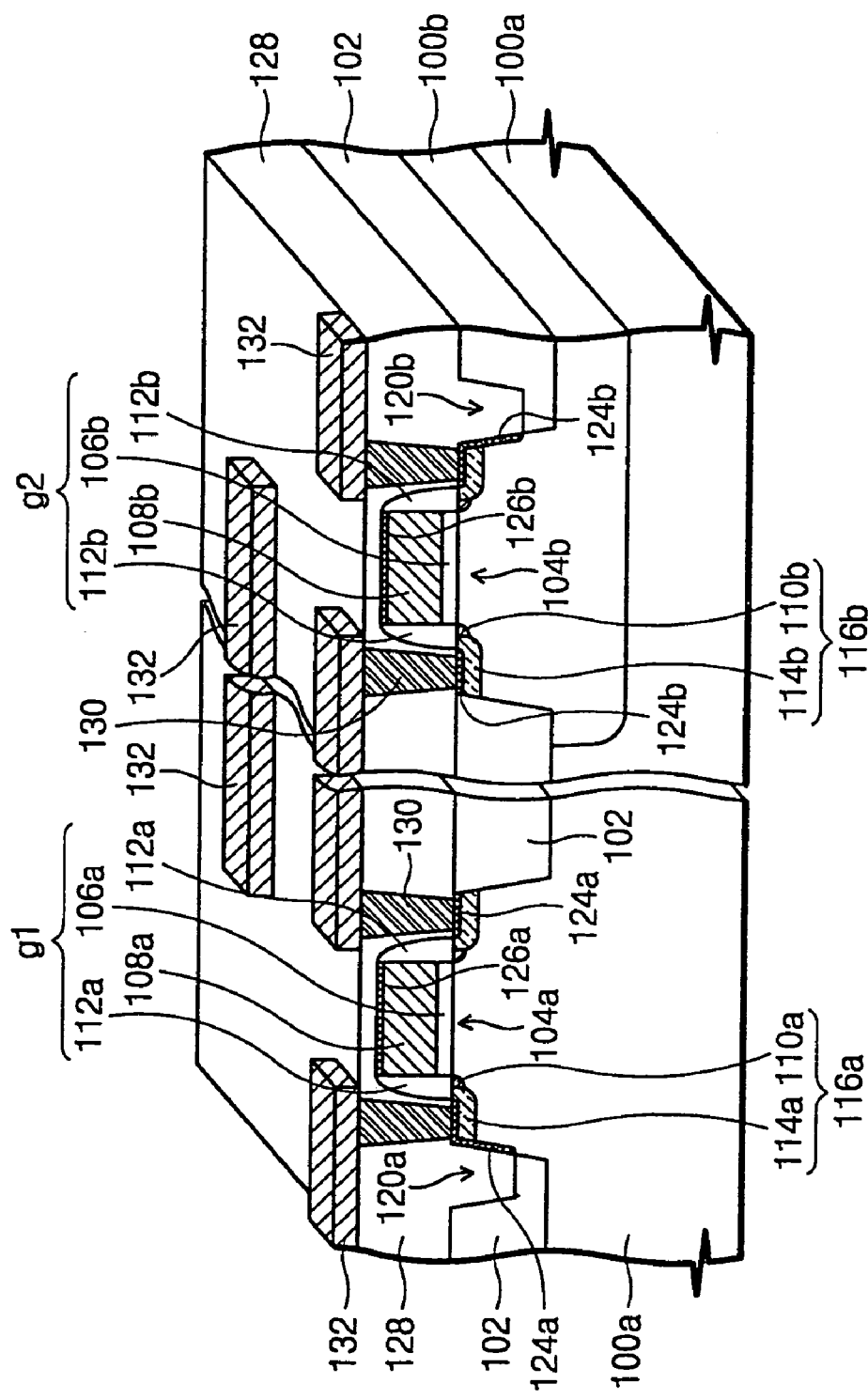
FIG. 3 is a perspective view for simplistically illustrating a semiconductor device according to an embodiment of the present invention.

FIG. 3 is a perspective view of a semiconductor device according to an embodiment of the present invention. Referring to FIG. 3, a device isolation layer 102 may be disposed in a predetermined region of a semiconductor substrate of N-type and P-type regions 100a and 100b. The isolation layer may comprise an outline to define first and second active regions 104a and 104b in the respective N-type and P-type regions 100a and 100b. N-type region 100a may comprise a conventional N-well formed within a P-type semiconductor substrate. Likewise, P-type region 100b may comprise a portion of a P-type semiconductor substrate, or it may comprise a conventional P-well formed in a semiconductor substrate.

A PMOS transistor may be formed in the N-type region 100a and an NMOS transistor may be formed in the P-type region 100b. The PMOS transistor may comprise a first gate pattern g1 that crosses the first active region 104a; and P-type source/drain regions 116a may be disposed in the first active region at opposite sides of the first gate pattern g1 (108a, 106a, 112a).

The first gate pattern g1 may comprise, in this embodiment, first gate electrode 108a that crosses the first active region 104a and gate insulation layer 106a disposed between the first gate electrode 108a and a surface of first active region 104a. Additionally, a first sidewall spacer 112a that may be formed of insulating material, may cover a sidewall of first gate electrode 108a. This "sidewall spacer" may be referenced alternatively as simply a "spacer".

The P-type source/drain regions 116a may comprise a double diffused drain (DDD) structure or a lightly doped drain (LDD) structure. For example, the P-type source/drain regions 116a may comprise a lightly diffused layer 110a and a heavily diffused layer 114a. The lightly diffused layer 110a may be formed in the first active region 104a laterally outward and adjacent to the first gate electrode 108a. The heavily diffused layer may be formed in the active region. But the heavily diffused layer may be spaced further outwardly from the gate electrode and more deeply than lightly diffused layer 110a. A surface region of P-type source/drain regions 116a may be covered with salicide 124a.

The NMOS transistor in the P-type region may comprise a second gate pattern g2 and N-type source/drain regions 116b disposed in a surface layer of the second active region 104b. The source drain regions 116b may be formed in the second active region on opposite sides of the second gate pattern g2. The second gate pattern g2 may comprise second gate electrode 108b that crosses the second active region and a second gate insulation layer 106b disposed between the second gate electrode 108b and the surface of the second active region 104b. Second sidewalls may comprise an insulation layer 112b against sidewalls of the second gate electrode 108b.

The N-type source/drain regions 116b of the NMOS transistor may be covered with salicide 124b. Like the source/drain regions 116a, the source/drain regions 116b may have an LDD or a DDD structure. In other words, the N-type source/drain region 116b may be formed of lightly diffused layer 110b and a second more deeply diffused layer 114b. The lightly diffused layer 110b may be formed by doping N-type ions into the second action region 104b on opposite sides of and adjacent to the second gate electrode 108b. The heavily diffused layer 114b may be formed further outwardly from the gate electrode and more deeply than the lightly diffused layer 110b. The gates may further comprise gate silicide layers 126a and 126b on respective first and second gate electrodes g1 and g2.

In this embodiment of the invention, the device isolation layer 102 adjacent to one of the P-type source/drain regions 116a of each PMOS transistor may be formed with a first recess 120a. The recess may expose a surface of the N-type region 100a adjacent to the selected one of the P-type source/drain region 116a neighboring the recess. The salicide layer 124a over the selected P-type source/drain region 116a may further comprise a portion that extends within first recess 120a to cover the exposed surface of N-type region 100a within the recess.

Likewise, a region of device isolation layer 102 adjacent to one of the N-type source/drain regions 116b of the NMOS transistor may also be formed with a recess (a second recess 120b). A surface of P-type region 100b adjacent to the one N-type source/drain region 116b neighboring the recess may face inwardly and be exposed by the second recess 120b. The salicide layer 124b on the neighboring N-type source/drain region 116b may further comprise a portion that extends beyond the source/drain region and into the second recess to cover the surface of P-type region 100b that was exposed and faces inwardly to the recess.

In addition, further referencing FIG. 3, a conventional interlayer insulation layer 128 may cover an entire surfaces of the NMOS and PMOS transistors. Penetrating the interlayer insulation layer 128, interconnections 132 may connect salicide layers 124a and 124b of the source/drain regions. According to this exemplary embodiment of the present invention, the recess of the device isolation layer adjacent the neighboring source/drain region and the silicide that couples the source/drain region to the well or substrate body within the recess, such features may allow ready application of a well or substrate bias to these regions made available by the recess. Accordingly, in comparison to some conventional devices, an additional area for applying a bias to a well or substrate is not required, and, even if a plurality of transistors are formed at the semiconductor substrate, the well bias can be applied to each transistor without need for increasing layout area.

Figure 4:
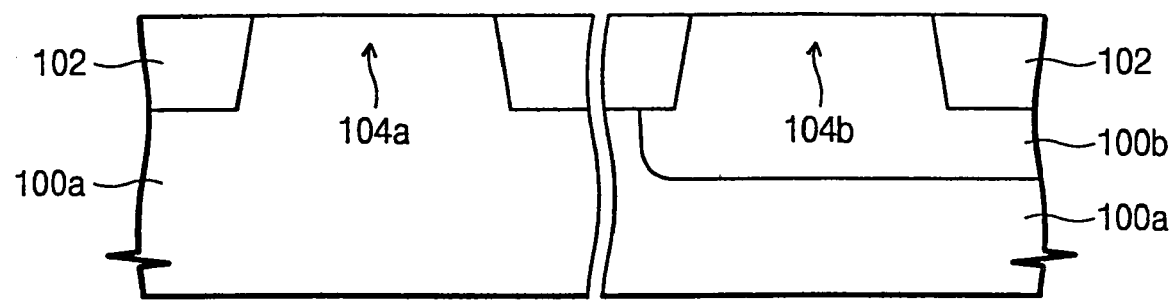
FIGS. 4 through 8 are cross-sectional views for simplistically illustrating different stages of a device through a method of fabricating the semiconductor device according to another embodiment of the present invention.

Referencing FIGS. 4 through 8, a method of fabricating a semiconductor device according to an embodiment of the present invention may include forming device isolation layer 102 in a predetermined region of a semiconductor substrate as shown in FIG. 4. An outline of the isolation layer may define first and second active regions 104a and 104b in N-type and P-type regions 100a and 100b, respectively. The N-type region 100a may comprise a conventional N-well that may be formed by doping N-type impurity ions into a P-type silicon substrate. The P-type region 100b may comprise a typical P-well that may be formed by doping P-type impurity ions into the silicon substrate or into N-well 100a.

Figure 5:
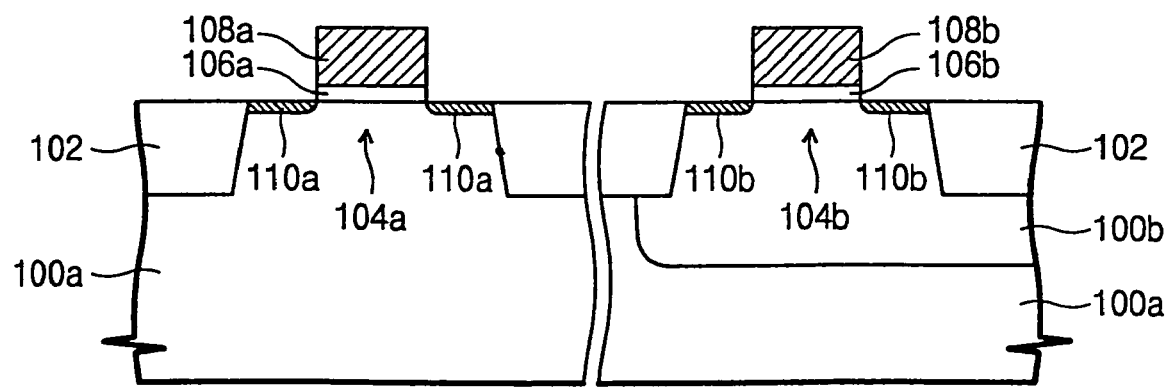

Referring to FIG. 5, first and second gate insulation layers 106a and 106b may be formed on first and second active regions 104a and 104b, respectively. The first and second gate insulation layers 106a and 106b may comprise same materials of same or, alternatively, different thicknesses. A gate conductive layer may be formed over the substrate and over the first and second gate insulation layers 106a and 106b. The gate conductive layer may comprise a doped polysilicon and may also comprise a metal silicide layer.

The gate conductive layer may be patterned to form first and second gate electrodes 108a and 108b that cross the first and second active regions 104a and 104b, respectively. When forming the gate conductive layers, different conductivity type materials may be formed on each of the respective first and second active regions 104a and 104b. As a result, for certain embodiments, the first and second gate electrodes 108a and 108b may comprise different conductivities relative to each other.

Further referencing FIG. 5, the first gate insulation layer 106a may be intervened between first gate electrode 108a and a surface of the first active region 104a, and the second gate insulation layer 106b may be intervened between the second gate electrode 108b and the second active region 104b.

When forming source/drain implants, gate electrodes 108a, 108b may be used as ion implantation masks. P-type impurity ions may be implanted into first active region 104a to form a lightly diffused layer 110a of P-type impurities into regions of the first active region 104a on opposite sides of the first gate electrode 108a. Likewise, N-type impurity ions may be implanted into regions of the second active region 104b, while using the second gate electrode 108b as an ion implantation mask, and, a lightly diffused layer 110b of N-type impurities may be formed in the second active region 104b on opposite sides of the second gate electrode 108b.

Figure 6:
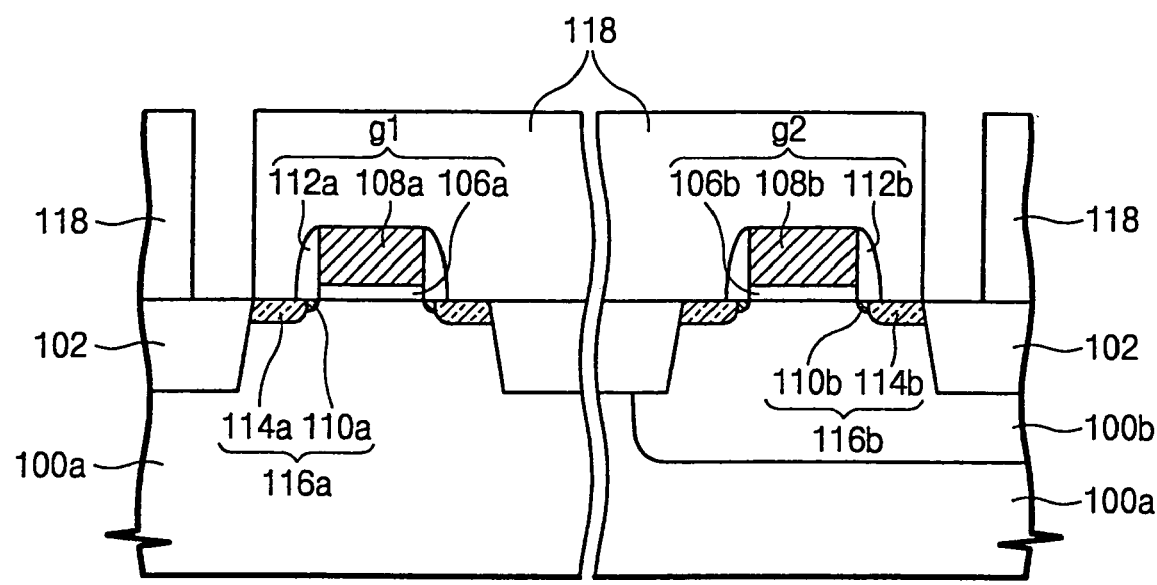

Referring to FIG. 6, in this embodiment, after forming the lightly diffused layers 110a, 110b first and second sidewall spacers 112a and 112b may be formed on sidewalls of the first and second gate electrodes 108a and 108b, respectively. The first gate electrode 108a, the first gate insulation layer 106a, and the first sidewall spacer 112a may be described collectively as first gate pattern g1. Likewise, the second gate electrode 108b, the second gate insulation layer 106b, and the second sidewall spacer 112b may be described collectively as second gate pattern g2.

After forming first sidewall spacers 112a, the first gate pattern g1 may serve as an ion implantation mask while P-type impurity ions may be implanted into the first active region 104a. Such implant may form heavily diffused layer 114a of P-type impurities into regions of the first active region 104a at opposite sides of the first gate pattern g1. Likewise, N-type impurity ions may be implanted into second active region 104b while using the second gate pattern g2 as an ion implantation mask. Such implant may form N-type heavily diffused region 114b into regions of the second active region 104b on opposite sides of the second gate pattern g2. The heavily diffused layer 114a and lightly diffused layer 110a of P-type impurities may be described collectively as a source/drain region 116a of the PMOS transistor. The N-type heavily diffused layer 114b and the N-type lightly diffused layer 110b, similarly, constitute source/drain regions 116b of the NMOS transistor.

Figure 7:
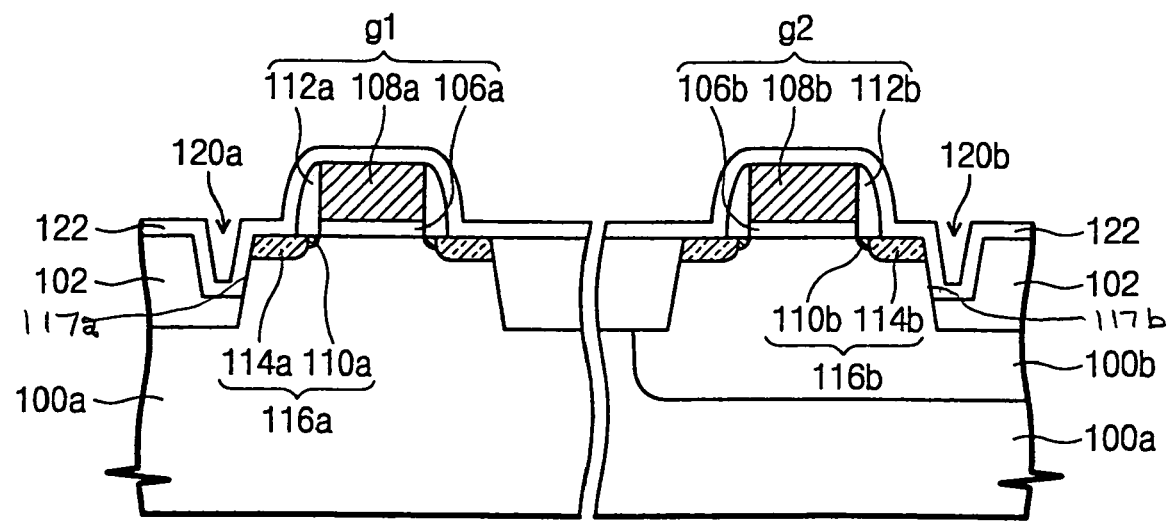

Next, further referencing FIG. 6, a photoresist pattern 118 may be formed on an entire surface of the resultant structure where the P-type and N-type source/drain regions 116a and 116b have been formed. Photoresist may be patterned to expose a predetermined region of the device isolation layer 102 adjacent to one of the P-type source/drain regions 116a as well as to expose a predetermined region of the device isolation layer 102 adjacent to one of the N-type source/drain regions 116b. While using the photoresist pattern 118 as an etch mask, the exposed regions of the device isolation layer 102 may be partially etched to form first and second recess 120a and 120b as shown in FIG. 7. The first and second recesses 120a and 120b, may be formed adjacent to one of the P-type source/drain regions 116a and one of the N-type source/drain regions 116b, respectively. The N-type region 100a of the substrate under the P-type source/drain region 116a may comprise a surface region 117a that may be exposed within first recess 120a. Similarly, P-type region 100b of the well under the N-type source/drain region 116b may comprise a surface 117b that may be exposed within the second recess 120b.

Further referencing FIG. 7, metal layer 122 may then be formed on an entire surface of the resultant structure where the first and second recessed regions 120a and 120b have been formed. In this embodiment, metal layer 122 may comprise at least one of the materials of the group consisting of nickel, cobalt, and titanium, which may form a silicide layer in combination with atoms of silicon, as may be associated with certain under lying structures, of the semiconductor substrate.

Figure 8:
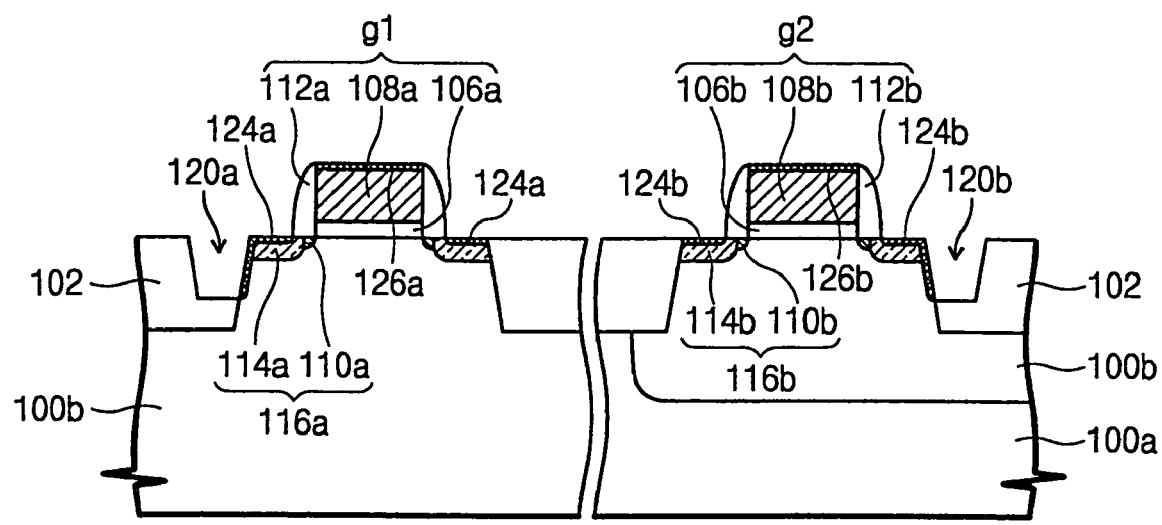

Referring to FIGS. 7 and 8, the resultant structure with metal layer 122 may be annealed to form a salicide layer, i.e., a self-aligned silicide layer. The silicide may be self-aligned to the underlying structures that may comprise silicon. As a result, first and second source/drain salicide layers 124a and 124b, and first and second gate salicide layers 126a and 126b may be formed on the P-type and N-type source/drain regions 116a and 116b, and the first and second gate electrodes g1 and g2, respectively. In this embodiment, the salicide may also be formed on the surface regions of the N-type and P-type regions 100a and 100b of the well or substrate as were exposed by the first and second recesses 120a and 120b. That is, one of P-type source/drain regions 116a neighboring recess 120a may comprise an overlying salicide layer 124a, which may extend into the recess to cover the exposed surface of N-type region 100a facing first recess 120a. Similarly, the second salicide layer 124b may be formed on one of N-type source/drain region 116b neighboring second recess 120b, and may be formed to include a portion that extends into the neighboring recess to cover the exposed surface of P-type region 100b facing second recess 120b. Metal remaining from metal layer 122 after the silicide anneal may then be removed.

Consequently, the PMOS and NMOS transistors remain in the N-type and P-type regions 100a and 100b of the semiconductor substrate, respectively. The PMOS transistor may comprise first gate pattern g1 and P-type source/drain regions 116a, whereas the NMOS transistor may comprise second gate pattern g2 and N-type source/drains 116b.

Next, a conventional interlayer insulation layer may be formed over an entire surface of the resultant structure where the NMOS and PMOS transistors have been formed. Interconnections may then be formed to provide connections to the source/drain regions and the gate electrodes of the NMOS and PMOS transistors.

Figure 9:
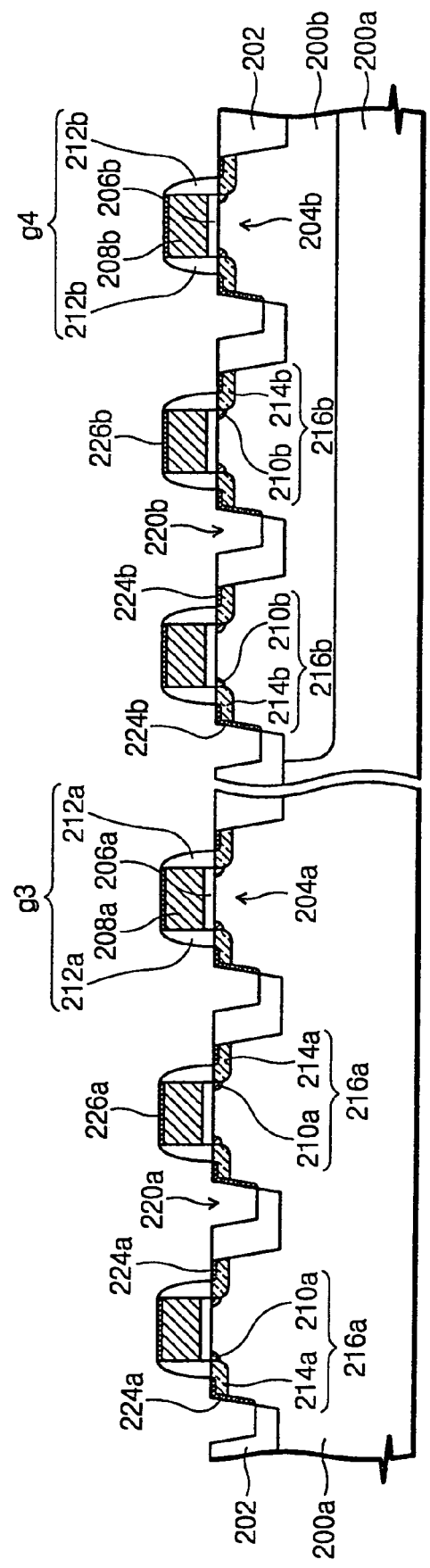
FIG. 9 is a cross-sectional view for simplistically illustrating a semiconductor device according to a further embodiment of the present invention.

FIG. 9 is a cross-sectional view a semiconductor device according to another embodiment of the present invention. Referring to FIG. 9, in accordance with another embodiment of the present invention, device isolation layer 202 may be formed in a predetermined region of a semiconductor substrate which may include both N-type and P-type regions 200a and 200b. An outline of the isolation layer 202 may define a plurality of first active regions 204a in the N-type region 200a, and a plurality of second active regions 204b in the P-type region 200b. The N-type region 200a may comprise an N-well where PMOS transistors may be formed. The P-type region may comprise a P-well or a P-type substrate where NMOS transistors may be formed. A first gate pattern g3 may cross each first active region 204a, and a second gate pattern g4 may cross each second active region 204b. First gate pattern g3 may include a first gate electrode 208a crossing first active region 204a, first gate insulation layer 206a intervened between the first gate electrode 208a and a surface of the first active region 204a. A first sidewall spacer 212a may cover a sidewall of the first gate electrode 208a. Each second gate pattern g4 may include a second gate electrode 208b crossing the second active region 204b, a second gate insulation layer 206b intervened between the second gate electrode 208b and a surface of the second active region 204b. Second sidewall spacer 212b may cover a sidewall of the second gate electrode 208b.

P-type source/drain regions 216a may be disposed in a surface layer of the first active region 204a at both sides of the first gate patterns g3. N-type source/drain regions 216b may be disposed in a surface layer of the second active region 204b on opposite sides of second gate patterns g4. As shown in FIG. 9, portions of the device isolation layer may be etched to form recesses adjacent to each of the transistors and neighboring one of the source/drain regions thereof. In other words, a recess 220a may be formed in a portion of device isolation layer 202 adjacent to one of the P-type source/drain regions 216a for each of the transistors of respective first active regions. Each recess 220a that neighbors the transistors of the first active regions may expose a portion of N-type region 200a under the P-type source/drain region 216a. Likewise, portions of device isolation layer 202 adjacent to each of the transistors and neighboring one of the N-type source/drain regions 216b thereof, such portions may be etched to form second recesses 220b. These second recesses may expose portions of P-type region 200b beneath the N-type source/drain regions 216b. A silicide layer may be formed self-aligned to the N-type and P-type source/drain regions 216a and 216b, to provide first and second source/drain salicide layers 224a and 224b on the source/drain regions of the respective first and second active regions 204a and 204b. The first source/drain salicide layers 224a may be disposed on the respective P-type source/drain region 216a of the first active regions 204a. The second source/drain salicide layers 224b may be disposed on the respective N-type source/drain regions 216b of the second active regions 204b. Silicide may also be formed self-aligned to surface regions of respective first and second gate electrodes 208a and 208b, i.e., to provide first and second gate salicide layers 226a and 226b on each of the first and second gate electrodes 208a and 208b.

As shown in FIG. 9, each of the first and second source/drain salicide layers 216a and 216b adjacent to the respective first and second recesses 220a and 220b may extend into the neighboring recess to cover exposed portions of N-type and P-type regions 200a and 200b within the respective recesses. Accordingly, when electrodes are connected to the salicide layers, a common bias may be applied to both the source/drain regions of the transistors adjacent to the recesses and the well or the semiconductor substrate commonly coupled thereto by the salicide.

In this embodiment of the present invention, the device isolation layer is formed with a recess that exposes a portion of the substrate or well. The bias may therefore be applied to the semiconductor substrate or well via the portions thereof that may be exposed by the recesses. By such embodiment, therefore, a well bias or substrate bias can be applied proximate each transistor to assist prevention of a latch-up phenomenon that might otherwise arise if the transistors were spaced separately from the substrate or well bias regions.

Figure 10:
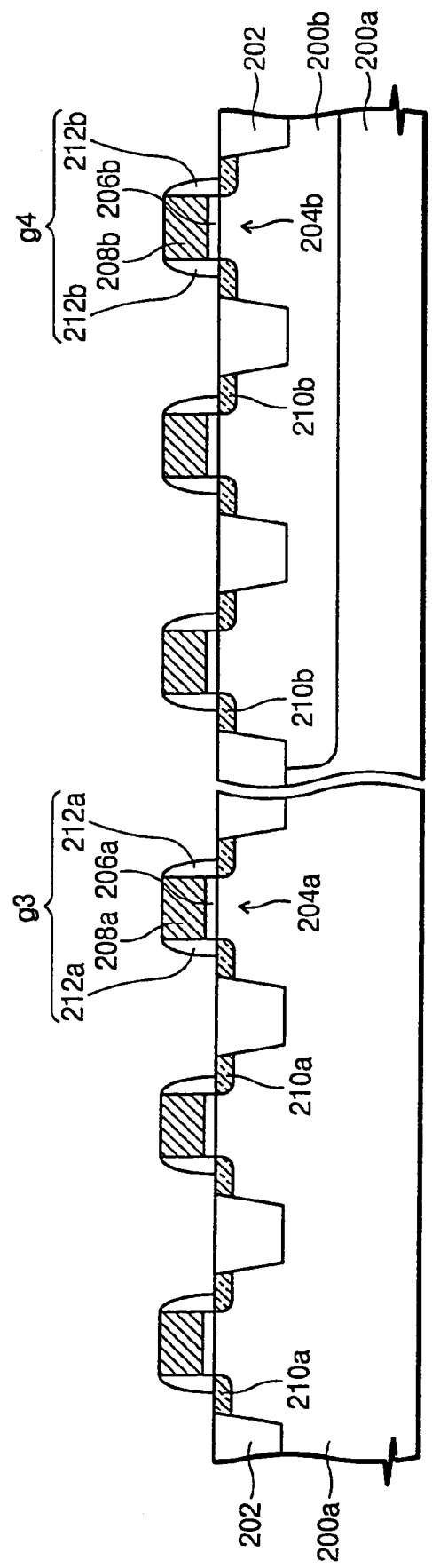
FIGS. 10 and 11 are cross-sectional views for simplistically illustrating a method of fabricating a semiconductor device according to another embodiment of the present invention.
Figure 11:
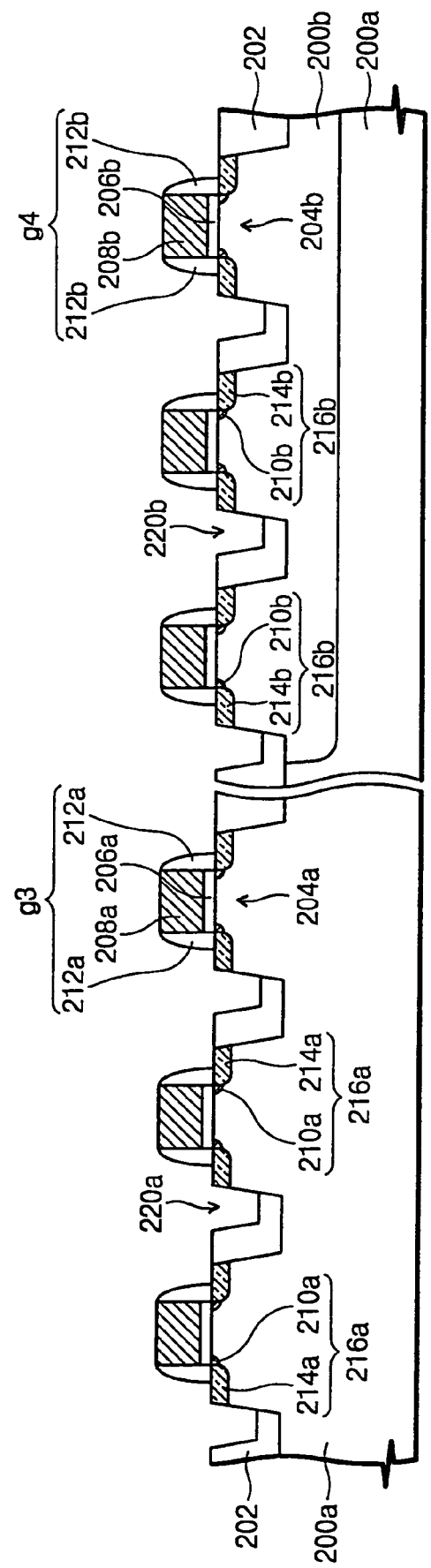

FIGS. 10 and 11 are simplified cross-sectional views for illustrating a method of fabricating a semiconductor device according to another embodiment of the present invention. Referring to FIG. 10, a device isolation layer 202 may be formed in a predetermined region of a semiconductor substrate of N-type and P-type regions 200a and 200b. A plurality of first active regions 204a may be defined by an outline of the device isolation layer in N-type region 200a. A plurality of second active regions 204b may be defined by an outline of the device isolation layer in the P-type region 200b. The N-type and P-type regions 200a and 200b may comprise N- and P-wells, respectively.

A gate insulation layer and a gate conductive layer may be formed on an entire surface of the resultant structure where the first and second active regions 204a and 204b have been defined by the outline of the device isolation layer. In certain embodiments, the gate insulation layer may comprise different thicknesses over respective N-type and P-type regions 200a and 200b. In addition, the gate conductive layers may comprise different conductivity types over respective N-type and P-type regions 200a and 200b.

Next, the gate conductive layer may be patterned to form first and second gate electrodes 208a and 208b that cross the first and second active regions 204a and 204b, respectively. A first gate insulation layer 206a may be disposed between first gate electrodes 208a and the surface of the first active regions 204a, whereas a second gate insulation layer 206b may be disposed between second gate electrodes 208b and the surface of the second active regions 204b.

The first gate electrodes 208a may then be used as an ion implantation mask while implanting P-type impurities to form a P-type lightly diffused layer 210a in the first active region 204a on opposite sides of each first gate electrode 208a. Similarly, N-type impurities may be implanted while using the second gate electrode 208b as an ion implantation mask and forming N-type lightly diffused layer 210b in the second active region 204b at both sides of each second gate electrode 208b. Thereafter, first sidewall spacers 212a may be formed on sidewalls of each first gate electrode 208a, and second sidewall spacers 212b may be formed on sidewalls of each second gate electrode 208b. The first gate electrode 208a, the first gate insulation layer 206a and the first sidewall spacer 212a may be referenced collectively as a first gate pattern g3. Likewise, the second gate electrode 208b, the second gate insulation layer 206b and the second sidewall spacer 212b may be referenced collectively as a second gate pattern g4.

Referring to FIG. 11, by using the first gate patterns g3 as an ion implantation mask, impurity ions may be implanted into exposed regions of first active regions 204a to form a P-type heavily diffused layer 214a. Likewise, impurity ions may be implanted into exposed regions of the second active regions 204b while using the second gate patterns g4 as an ion implantation mask to form N-type heavily diffused layer 214b. The P-type lightly diffused layer and the P-type heavily diffused layer together form P-type source/drain regions 216a. Likewise, the N-type lightly diffused layer and the N-type heavily diffused layer together form N-type source/drain regions 216b.

The first gate patterns g3 as well as the P-type source/drain regions 216a disposed in the first active regions 204a constitute PMOS transistors. While in the second active regions 204b, the second gate patterns g4 as well as the N-type source/drain regions 216b constitute NMOS transistors. The portions of device isolation layer 202 adjacent to one of the P-type source/drain regions 216a of each PMOS transistor may be etched to form first recesses 220a, whereas other portions of device isolation layer 202 adjacent to one of the N-type source/drain regions 216b of each NMOS transistor may be etched to form second recesses 220b. Portions of N-type region 200a under the respective P-type source/drain regions 216a neighboring the first recessed may be exposed by the first recesses 220a, and portions of the P-type region 200b under the N-type source/drain regions 216b may be exposed by the second recesses 220b.

Although not shown in the drawings of FIGS. 10–11, a silicidation process, as described earlier herein relative to FIGS. 7–8, may be used to form salicide layers (224a, 224b, 226a, and 226b of FIG. 9). According to this embodiment of the present invention, portions of the device isolation layer adjacent to each of a plurality of NMOS and PMOS transistors may be recessed so that a bias can be applied to exposed regions of a well or substrate within the recesses. As a result, an area requisite for well biasing may be reduced while, at the same time, it may assist prevention of the latch-up phenomenon.

According to particular exemplary embodiments described above, portions of the device isolation layer may be recessed to expose regions of a semiconductor substrate or well under each transistor. A common bias may then be applied to both the exposed regions of the semiconductor substrate or well and the respective source/drain regions of the transistors. Consequently, the common biasings proximate the respective transistors may be capable of preventing the latch-up phenomenon or noise and may be realized without need for an increase in the area of the semiconductor device as might otherwise be required to accommodate the well biasing provisions.

In the drawings and specification, there have been disclosed typical embodiments of this invention and, although specific terms are employed, they may be used in a generic and descriptive sense only and not for purposes of limitation. Additionally, it will be apparent to those skilled in this art that the particular embodiments illustrated or described herein are exemplary and that various changes and modifications may be made thereto as become apparent upon reading the present disclosure. Accordingly, such changes and modifications shall be deemed to fall within the scope of the appended claims.

What is claimed is:

1. A method of fabricating a semiconductor substrate, comprising:
    forming an isolation layer in a substrate of first conductivity type to define an active region;
    diffusing impurities of second conductivity type in a predetermined region of the active region to form an impurity diffused region;
    recessing a region of the isolation layer and exposing a portion of the substrate of first conductivity type under the impurity-diffused region; and
    forming a salicide layer on a surface of the impurity-diffused region and on a surface of the exposed portion of the substrate of first conductivity type.

2. The method of claim 1, in which recessing a region of the isolation layer and exposing a portion of the substrate comprises etching the device isolation layer to a depth deeper than a depth of the impurity diffused region.

3. The method of claim 1, in which the forming the salicide layer comprises:
    forming metal on the impurity diffused region, on the active region, and on the walls of the recess; and
    annealing the metal layer to diffuse atoms of the metal into portions of the active region in contact with the metal and into portions the substrate of first conductivity type in contact with the metal.

4. The method of claim 3, in which the metal comprises at least one material selected from the group consisting of cobalt, titanium, and nickel.

5. A method of fabricating a semiconductor device, comprising:

forming a device isolation layer in a predetermined region of a substrate of first conductivity type to define an active region;

forming a gate pattern crossing the active region;

forming a source/drain region of second conductivity type in the active region at both sides of the gate pattern;

patterning the device isolation layer to form a recess in the device isolation layer that exposes a portion of the substrate of first conductivity type adjacent the source/drain region at one side of the gate pattern; and siliciding a surface of the source/drain region of second conductivity type and a surface of the substrate of first conductivity type exposed by the recess.

6. The method of claim 5, in which patterning the device isolation layer to form a recess comprises etching the device isolation layer to a depth deeper than the thickness of the source/drain region of second conductivity type.

7. The method of claim 5, in which the forming the gate pattern comprises:

forming a gate insulation layer over the active region and a gate conductive layer over the gate insulation layer;

patterning the gate conductive layer to form a gate electrode crossing the active region; and forming a sidewall spacer on a sidewall of the gate electrode.

8. The method of claim 7, in which the forming the source/drain region of second conductivity type comprises:

after forming the gate electrode, implanting impurity ions into a first surface region of the active region to form a lightly diffused layer into the first surface region at both sides of the gate electrode; and after forming the sidewall spacer, implanting impurity ions into a second surface region of the active region to form a heavily diffused layer into the second surface region at both sides of the gate electrode with sidewall spacer;

the heavily diffused layer formed with a depth deeper than the depth of the lightly diffused layer.

9. The method of claim 5, in which the siliciding comprises:

forming metal on the exposed surface of the source/drain region and on the portion of the substrate of first conductivity type exposed by the recess; and annealing the metal on the exposed surfaces to silicide a surface of the source/drain region of second conductivity type in contact with the metal and to silicide a surface of the substrate of first conductivity type in contact with the metal and facing the recess.

10. The method of claim 9, in which the siliciding further comprises siliciding a top surface of the gate electrode to form a gate salicide layer.

11. The method as claimed in claim 9, in which the metal comprises at least one of cobalt, nickel, and titanium.

12. A method of fabricating a semiconductor device, comprising:

forming a device isolation layer in a semiconductor substrate having N-type and P-type regions;

the device isolation layer defining first and second active regions in the N-type and P-type regions, respectively;

forming first and second gate patterns crossing the first and second active regions, respectively;

forming a P-type source/drain region in the first active region at both sides of the first gate pattern;

forming an N-type source/drain region in the second active region at both sides of the second gate pattern;

patterning the device isolation layer to form first and second recesses;

the first recess exposing a portion of the N-type region of the substrate adjacent to the P-type source/drain region at one side of the first gate pattern;

the second recess to exposing a portion of the P-type region of the substrate adjacent to the N-type source/drain region at one side of the second gate pattern; and siliciding the exposed portions of the N-type and P-type regions facing respective first and second recesses; and siliciding surfaces of the N-type and P-type source/drain regions of respective second and first active regions.

13. The method of claim 12, in which the forming the first and second gate patterns comprises:

sequentially forming a gate insulation layer and a gate conductive layer on the first and second active regions;

patterning the gate conductive layer to form first and second gate electrodes that cross the first and second active regions, respectively; and forming spacers on sidewalls of each of the first and second gate electrodes.

14. The method as claimed in claim 13, in which the forming the N-type and P-type source/drain regions comprises:

after forming the first and second gate electrodes:

implanting P-type impurity ions into the first active region to form a lightly diffused P-type layer; and implanting N-type impurity ions into the second active region to form a lightly diffused N-type layer; and after forming the first and second sidewall spacers:

implanting P-type impurity ions into the first active region to form a heavily diffused P-type layer of depth deeper than the lightly diffused P-type layer; and implanting N-type impurity ions into the second active region to form a heavily diffused N-type layer of depth deeper than the lightly diffused N-type layer.

15. The method of claim 12, in which the first and second recesses are formed by etching the device isolation layer to a depth deeper than the P-type and N-type source/drain regions.

16. The method of claim 12, in which the siliciding comprises:

forming metal on exposed surfaces including walls of the first and second recesses; and annealing the metal and siliciding surfaces of the P-type and N-type source/drain regions in contact with the metal and siliciding the exposed surfaces of N-type and P-type materials of the substrate in contact with the metal within the first and second recesses respectively.

17. The method of claim 16, in which the metal layer comprises at least one of cobalt, nickel and titanium.

* * * * *

UNITED STATES PATENT AND TRADEMARK OFFICE
CERTIFICATE OF CORRECTION

PATENT NO. : 7,074,683 B2  
APPLICATION NO. : 10/796754  
DATED : July 11, 2006  
INVENTOR(S) : Sun-Ha Hwang et al.

Page 1 of 1

It is certified that error appears in the above-identified patent and that said Letters Patent is hereby corrected as shown below:

Column 3, line 13, the word "suicide" should read -- silicide --;  
Column 6, line 33, the word "spacers" should read -- spacer --.

Signed and Sealed this

Eighteenth Day of August, 2009

David J. Kappos  
*Director of the United States Patent and Trademark Office*